(12) United States Patent
Yamagami

(10) Patent No.: US 7,301,840 B2
(45) Date of Patent: Nov. 27, 2007

(54) SEMICONDUCTOR MEMORY DEVICE

(75) Inventor: Yoshinobu Yamagami, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/266,408

(22) Filed: Nov. 4, 2005

(65) Prior Publication Data

US 2006/0120142 A1    Jun. 8, 2006

(30) Foreign Application Priority Data

Dec. 7, 2004    (JP)    ............................. 2004-354520

(51) Int. Cl.
*G11C 7/02*    (2006.01)

(52) U.S. Cl. .................. 365/210; 365/189.07

(58) Field of Classification Search .................. 365/210
See application file for complete search history.

(56) References Cited

U.S. PATENT DOCUMENTS 6,201,757 B1    3/2001    Ward et al.

6,392,957 B1 *    5/2002    Shubat et al. ................ 365/233
6,556,472 B2 *    4/2003    Yokozeki ..................... 365/154
6,999,367 B2 *    2/2006    Yamagami ................... 365/210

FOREIGN PATENT DOCUMENTS

| JP | 09-147574 | 6/1997 |
| JP | 11-096768 | 4/1999 |
| JP | 2002-367377 A | 12/2002 |

\* cited by examiner

*Primary Examiner*—Amir Zarabian
*Assistant Examiner*—Kretelia Graham
(74) *Attorney, Agent, or Firm*—McDermott Will & Emery LLP

(57) ABSTRACT

There provided a semiconductor memory device which ensures writing to all memory cells regardless of fluctuations in properties of the memory cells caused by manufacturing error or the like and can reduce write operation time and power consumption. Write operations for a memory cell 1 and a dummy memory cell 1a are controlled based on a write amplifier control signal WAE. Write operation end timing is determined based on a write completion signal WRST which indicates a storage state of the dummy memory cell 1a. The dummy memory cell 1a and peripheral circuitry are designed so that write time required for the dummy memory cell 1a is more than or equal to a maximum of write time required for the memory cells 1.

9 Claims, 10 Drawing Sheets

SEMICONDUCTOR MEMORY DEVICE

BACKGROUND OF THE INVENTION

1. Field of the Invention

The present invention relates to a semiconductor memory device incorporating dummy memory cells.

2. Description of the Background Art

In general, a semiconductor memory device comprises a memory cell array section having memory cells arrayed in a matrix manner, and peripheral circuitry. And conventionally, there has been proposed a semiconductor memory device in which dummy memory cells having the same properties as those of memory cells are incorporated beside the memory cell array section for a purpose other than information storage.

Dummy memory cells are often incorporated for timing control during read processing, such as generation of a sense amplifier control signal, (for example, refer to Japanese Laid-Open Patent Publication No. 2002-367377 (FIG. 1) and Japanese Laid-Open Patent Publication No. 11-96768). A semiconductor memory device in which dummy memory cells are incorporated for timing control during write operation has been proposed (for example, refer to Japanese Laid-Open Patent Publication No. 9-14574 (FIG. 5)), though not many. In Japanese Laid-Open Patent Publication No. 9-147574, a semiconductor memory device which includes a timing compensation section having a dummy write amplifier, dummy memory cells, and a delay control circuit or the like, in addition to a memory cell array section and peripheral circuitry is disclosed.

Time (herein after, referred to as write time) required for writing to a dummy memory cell which has the same properties as those of a memory cell and performs an operation in synchronization with the same signals as those associated with a memory cell is approximately the same as write time required for a memory cell. Taking advantage of this, therefore, in the semiconductor memory device disclosed in Japanese Laid-Open Patent Publication No. 9-147574, a write control signal is generated by using a signal outputted from the dummy memory cell. More specifically, based on timing when writing to the dummy memory cell is completed, pulse fall timing of a write control signal and further write operation end timing are determined. Write operations for the memory cell and the dummy memory cell are performed based on this write control signal.

In the meantime, because there are fluctuations in properties of the memory cell, which are caused by supply voltage dependency, temperature properties, and manufacturing error of respective transistors or the like comprising a memory cell, the write time fluctuates among the memory cells. Therefore, processing time for writing to the memory cell is set longer so that writing to every memory cell can be ensured. For example, in the semiconductor memory cell disclosed in Japanese Laid-Open Patent Publication No. 9-147574, write operation end timing is determined by a signal, indicating that the writing to the dummy memory cell is ended, which is delayed in the delay control circuit for a predetermined period of time.

However, longer write operation time dissatisfies user's demand for high-speed writing and may cause a disadvantage that charge/discharge currents from the memory cell to a bit line pair increase, thus resulting in an increase in power consumption of the semiconductor memory cell. On the contrary, excessively short write operation time may be likely to fail to ensure stable data writing.

SUMMARY OF THE INVENTION

Therefore, an object of the present invention is to provide a semiconductor memory device which performs write control at appropriate write timing regardless of fluctuations in properties of a memory cell caused by manufacturing error or the like.

A semiconductor memory device according to the present invention is characterized in that write operation end timing for a memory cell is determined by using a dummy memory cell, the semiconductor memory device comprises: a plurality of memory cells; a dummy memory cell; a write state detection section for outputting a write completion signal when the dummy memory cell takes a predetermined storage state; and a write operation section for performing a write operation based on the write completion signal, and write time required for the dummy memory cell is more than a maximum of write time required for the memory cells.

According to an aspect of the present invention, transistors included in the dummy memory cell are connected in a same manner as corresponding transistors included in the memory cell, and a property of at least one transistor included in the dummy memory cell may be different from a property of the corresponding transistor included in the memory cell.

More specifically, a gate length of the at least one transistor included in the dummy memory cell may be different from a gate length of the corresponding transistor included in the memory cell.

And a gate width of the at least one transistor included in the dummy memory cell may be different from a gate width of the corresponding transistor included in the memory cell.

At least two transistors among a plurality of transistors included in the dummy memory cell are arranged in a symmetrical manner, and gate lengths of the at least two transistors are mutually different in at least one couple of the at least two transistors.

At least two transistors among the plurality of transistors included in the dummy memory cell are arranged in the symmetrical manner, and gate widths of the at least two transistors are mutually different in at least one couple of the at least two transistors.

According to another aspect of the present invention, transistors, corresponding to transistors included in the memory cell, included in the dummy memory are connected in a same manner as the transistors included in the memory cell and a load on a predetermined node included in the dummy memory cell may be larger than a load on a node, corresponding to the predetermined node included in the dummy memory cell, included in the memory cell.

According to another aspect of the present invention, a load on a dummy bit line connected to the dummy memory cell may be larger than a load on a bit line connected to the memory cell.

According to another aspect of the present invention, the write operation section comprises a write amplifier for controlling a voltage applied to a bit line pair connected to the memory cell and a dummy write amplifier for controlling a voltage applied to a dummy bit line pair connected to the dummy memory cell, and a capability of the dummy write amplifier may be less than a capability of the write amplifier.

The semiconductor memory device according to the present invention is capable of ensuring writing to all memory cells and generating a write control signal having an optimum pulse width. In other words, according to the semiconductor memory device of the present invention, a write operation is not ended before the writing to the memory cells has been completed and write operation time is not excessively longer than necessary. The semiconductor memory device according to the present invention can realize high-speed writing with low power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
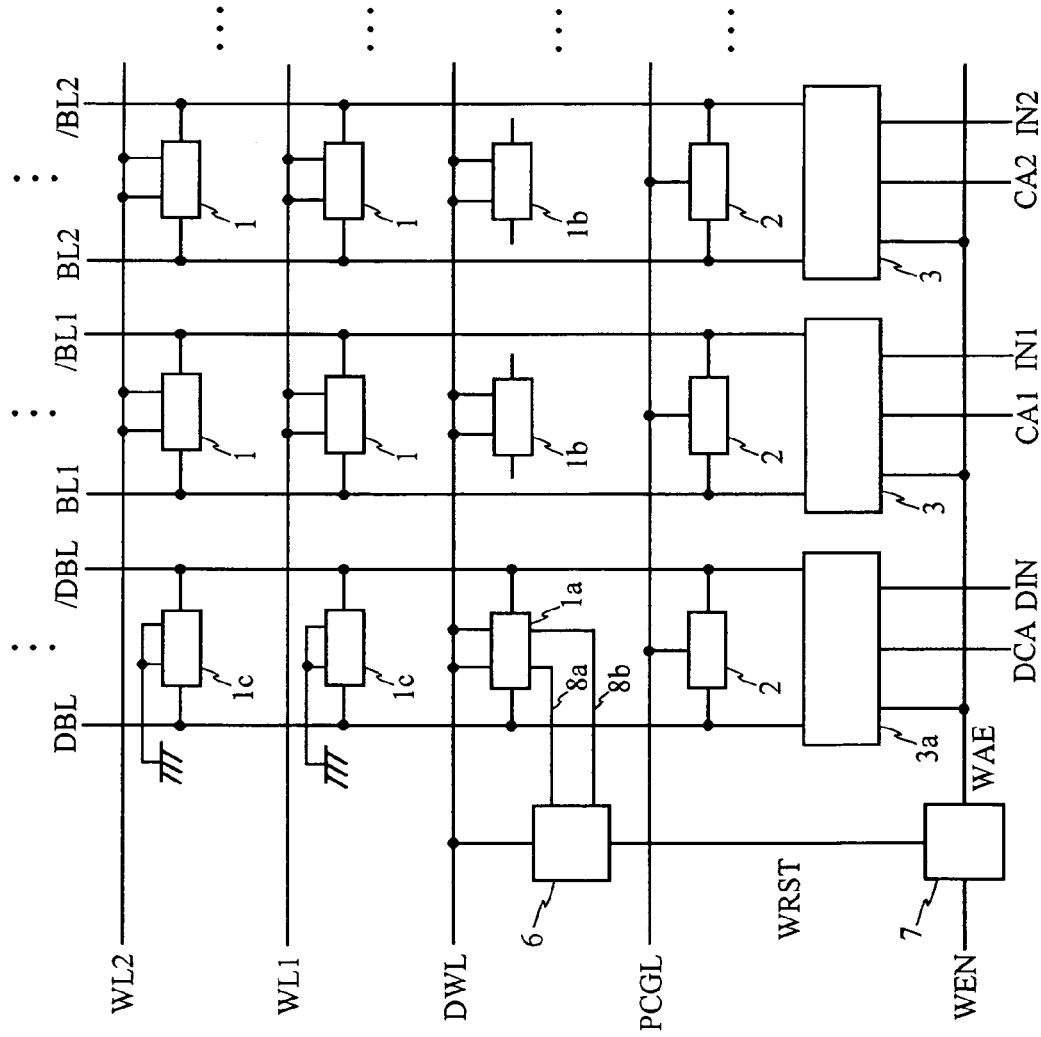
FIG. 1 is a structural diagram showing a semiconductor memory device according to the present invention.

FIG. 1 is a structural diagram showing a portion of a semiconductor memory device according to the present invention. The semiconductor shown in FIG. 1 comprises memory cells 1, dummy memory cells 1a, 1b, and 1c, precharge circuit sections 2, write amplifiers 3, a dummy write amplifier 3a, a write state detection section 6, and a write amplifier control section 7.

The memory cells 1 are each arranged at an intersection between a word line WLn (n is an integer more than or equal to 1) wired in a row direction and a bit line pair {BLm and /BLm} (m is an integer more than or equal to 1) wired in a column direction. The memory cells 1 arranged in a matrix manner compose a memory array section for storing information. The dummy memory cells 1a, 1b, and 1c are arranged in a circumference of the memory array section. Among the dummy memory cells, the dummy cell 1a is arranged at an intersection between a dummy word line DWL and a dummy bit line pair {DBL and /DBL}. Each of the memory cells 1 and the dummy memory cells 1a, 1b, and 1c have a structure capable of storing 1 bit of digital data (either 1 or 0). However, the dummy memory cell 1a is provided as a portion of a timing compensation section for determining processing time of writing to the memory cells 1, not for storing information.

The dummy memory cell 1b is arranged at an intersection between the dummy word line DWL and the bit line pair {BLm and /BLm}. The dummy memory cell 1c is arranged at an intersection between the word line WLn and the dummy bit line pair {DBL and /DBL}. The dummy memory cells 1b and 1c have a same circuit structure as those of the memory cells 1.

However, the dummy memory cell 1b is not connected to the bit line pair {BLm and /BLm} unlike the memory cells 1. This is because the dummy memory cells 1b are provided in order to ensure that the load on the dummy word line DWL is equal to the load on the word line WLn. The "load on the word line" as used herein includes, among others, wiring resistance and wiring capacitance components associated with a word line WL and a capacitance component associated with any transistor which is connected to the word line WL.

And the dummy memory cells 1c are provided in order to ensure that the load on the dummy bit line pair {DBL and /DBL} is equal to the load on the bit line pair {BLm and /BLm}. Therefore the dummy memory cells 1c are not connected to the word lines WL, and the word line input terminal of each dummy memory cell 1c is grounded. The "load on the bit line pair {BL and /BL}" as used herein includes, among others, wiring resistance and wiring capacitance components associated with a bit line pair and a capacitance component associated with any transistor which is connected to the bit line pair {BLm and /BLm}.

As shown in FIG. 1, the dummy memory cell 1a is electrically connected to the write state detection section 6 via wires 8a and 8b. The write state detection section 6 outputs a write completion signal WRST of a voltage level according to a storage state of the dummy memory cell 1a (a write state of the dummy memory 1a).

The write amplifier control section 7 generates a write amplifier control signal WAE which is a write control signal for writing to the memory cells 1 and the dummy memory cells 1a. A write operation start timing indicated by the write amplifier control signal WAE is determined based on a shift of a write enable signal WEN, and write operation end timing is determined based on a shift of the write completion signal WRST.

The write amplifier control signal WAE, a column selection signal CAm for controlling a selection state of the bit line pair {BLm and /BLm}, and data INm to be written to a memory cell 1 are inputted to the write amplifier 3 which is a voltage control circuit for the bit line pair {BLm and /BLm}. To the memory cell 1 which is included in a column being in a selection state according to the column selection signal CAm and which is connected to a word line WL in a selection state, writing of data INm starts at write operation start timing indicated by the write amplifier control signal WAE.

On the other hand, the write amplifier control signal WAE, a dummy column selection signal DCA for controlling a selection state of a dummy bit line pair {DBL and /DBL}, and data DIN to be written to a dummy memory cell 1a arc inputted to the dummy write amplifier 3a which is a voltage control circuit for the dummy bit line pair {DBL and /DBL}. When a dummy column selection signal DCA is inputted and a dummy word line DWL takes a selection state, a write operation of the dummy data DIN for the dummy memory cell 1a starts at a write operation start timing indicated by the write amplifier control signal WAE.

Whenever write operation to any memory cell 1 is performed, it is ensured that the write operation to the dummy memory cell 1a is also performed. When the write state detection section 6 detects completion of writing to the dummy memory cell 1a (that is, when the dummy memory cell 1a has stored the dummy data DIN), the write state detection section 6 outputs a write completion signal WRST indicating the write completion.

The write amplifier control section 7 outputs the write amplifier control signal WAE, according to the write completion signal WRST indicating the completion of writing to the dummy memory cell 1a, which causes the write amplifier 3 and the dummy write amplifier 3a to take an inactive state. And in synchronization with the output of the write amplifier control signal WAE, the voltage level of the word line is also controlled and the word line takes a non-selection state. Thus one write operation for one memory cell 1 and one write operation for one dummy memory cell 1a end.

After the write operation for the memory cell 1 and the dummy memory cell 1a has ended, for a period existing until a next write operation starts, a voltage level of a bit line precharge line PCGL is controlled so that the precharge circuit sections 2 take an active state. And after the precharge circuit sections 2 have precharged the bit line pair {BLm and /BLm} and the dummy bit line pair {DBL and /DBL}, the next write operation for a memory cell 1 and a dummy memory cell 1a starts.

As described above, because the dummy memory cell 1a and the memory cell 1 have the same circuit structure; the load on the dummy word line DWL is equal to the load on the word line WLn; and the load on the dummy bit line pair {DBL and /DBL} is equal to the load on the bit line pair {BLm and /BLm}, write conditions are the same between the dummy memory cell 1a and the memory cell 1. Therefore, if the memory cell 1and the dummy memory cell 1a have the same properties, the write completion timing for the memory cell 1 approximately coincides with the write completion timing for the dummy memory cell 1a.

However, because the properties of transistors or the like included in the memory cell 1 and the dummy memory cell 1a are not completely uniform due to manufacturing error or the like, even if the memory cell 1and the dummy memory cell 1a are similarly designed and manufactured, fluctuations in the properties of each memory cell 1 and dummy memory cell 1a may arise. Therefore, on the semiconductor memory device according to this embodiment, this problem is solved by designing the write time required for the dummy memory cell 1a to be longer than or equal to the write time required for the memory cell 1, for example, as described below.

Figure 2:
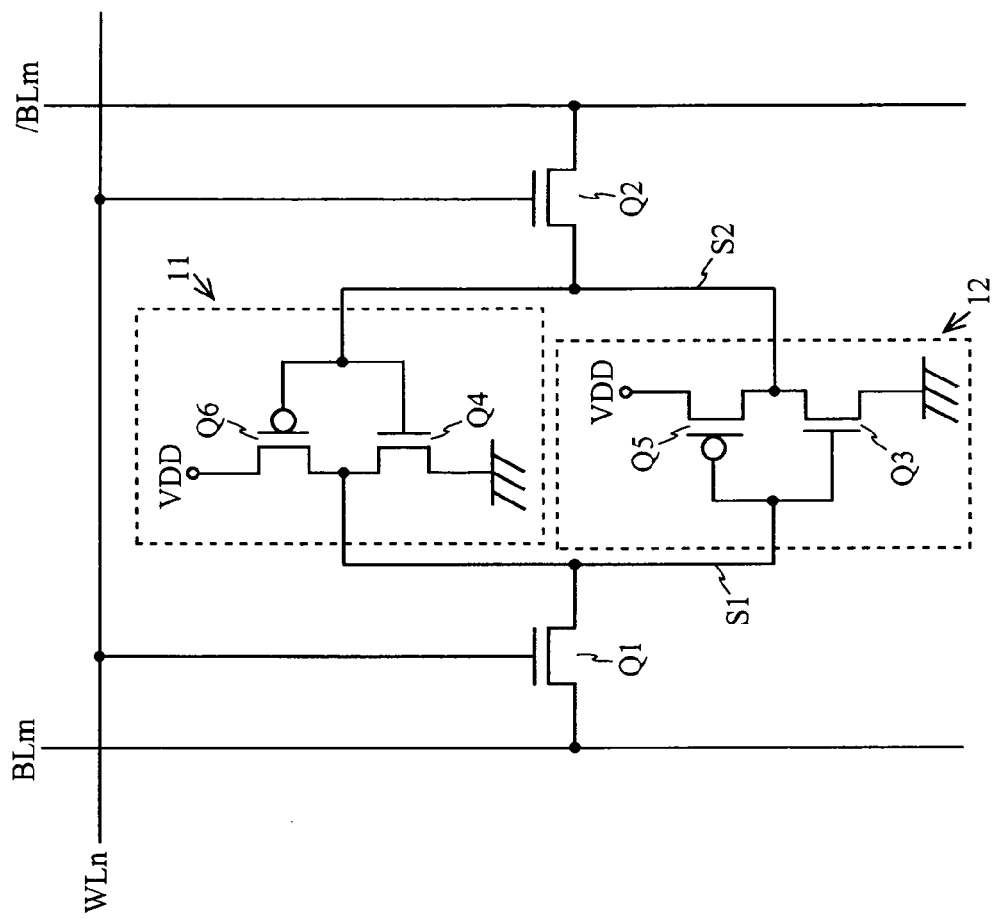
FIG. 2 is a circuitry diagram showing a memory cell.
Figure 3:
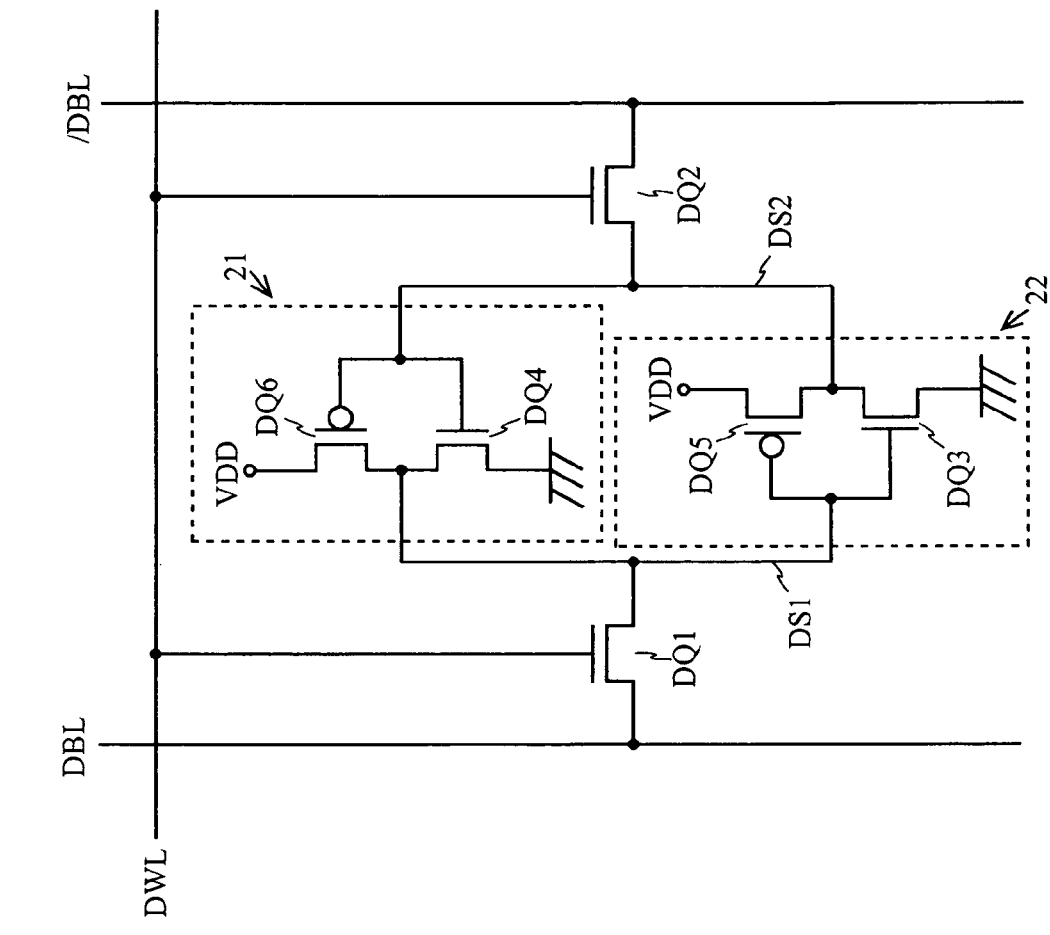
FIG. 3 is a circuitry diagram showing a dummy memory cell.
Figure 4:
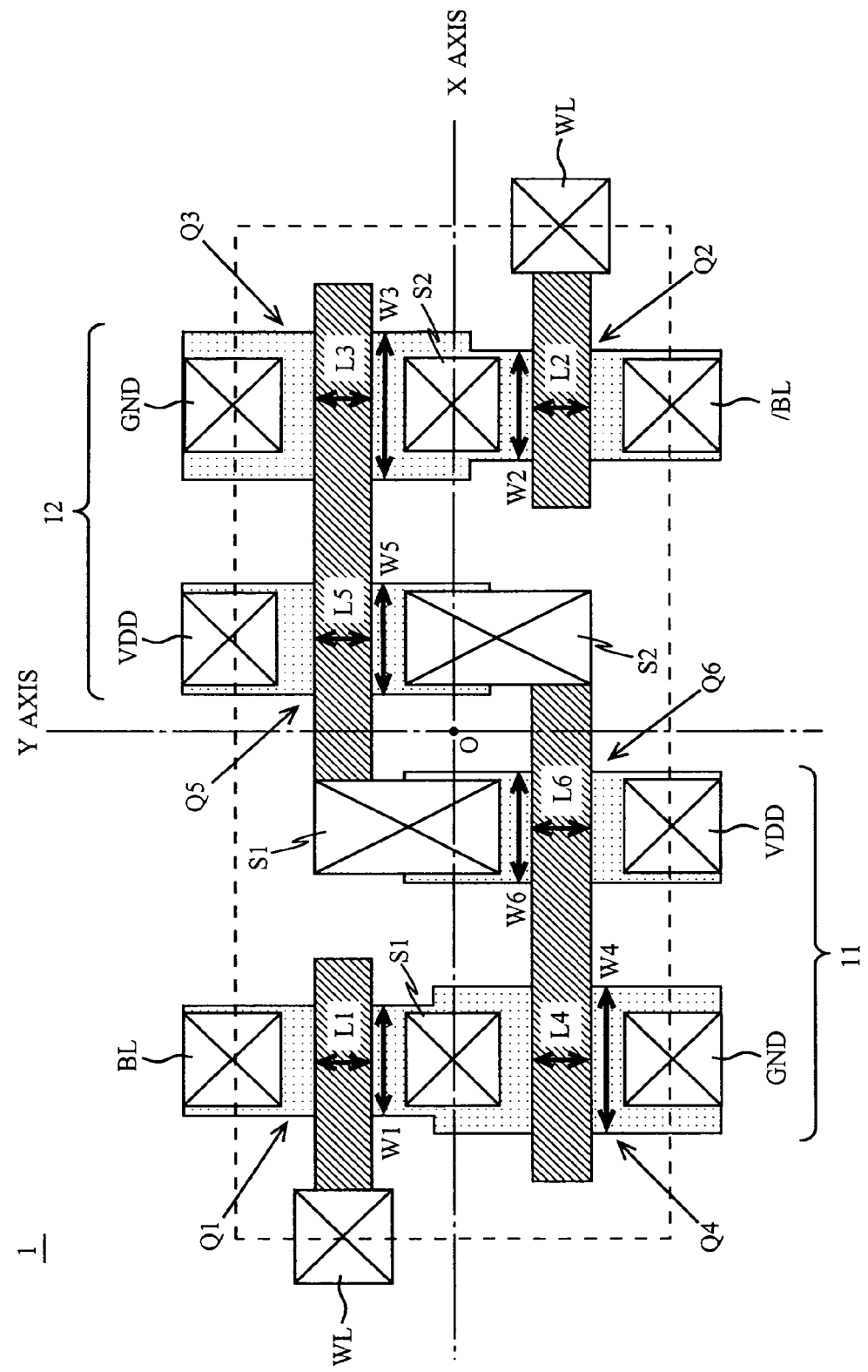
FIG. 4 is a layout diagram of the memory cell.
Figure 5:
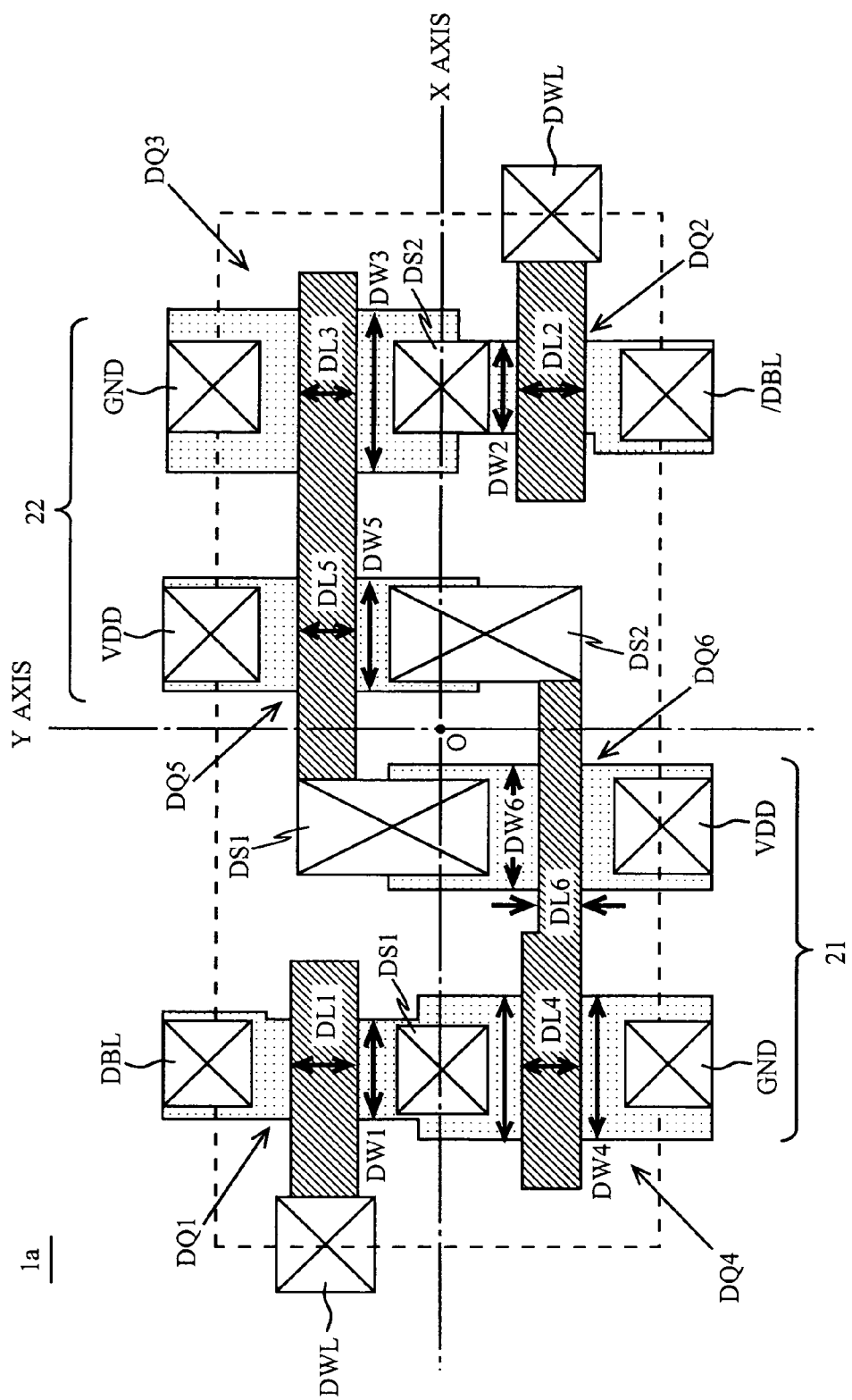
FIG. 5 is a layout diagram of the dummy memory cell.

FIG. 2 and FIG. 3 show circuit diagrams of examples of a memory cell 1 and a dummy memory cell 1a, respectively. FIG. 4 and FIG. 5 show layouts of the examples of the memory cell 1 and the dummy memory cell 1a shown in the circuit diagrams in FIG. 2 and FIG. 3. As shown in FIG. 2 to FIG. 5, arrangement of active elements (transistors Q1 to Q6) in the memory cell 1 is a same as that of active elements (transistors DQ1 to DQ6) in the dummy memory cell 1a. And the dummy memory cell 1a is composed so that the transistors DQ1 to DQ6 corresponding to the transistors Q1 to Q6 in the memory cell 1 are connected in the same manner as the transistors Q1 to Q6 are.

As shown in FIG. 2 and FIG. 4, the memory cell 1 comprises a first inverter 11 including a load transistor Q6 and a drive transistor Q4, a second inverter 12 including a load transistor Q5 and a drive transistor Q3, and access transistors Q1 and Q2. The first inverter 11 and the second inverter 12 are connected via memory hold nodes S1 and S2 (hereinafter, simply referred to as nodes S1 and S2), thereby composing a latch circuit.

As shown in FIG. 3 and FIG. 5, the dummy memory cell 1a comprises a first inverter 21 including a load transistor DQ6 and a drive transistor DQ4, a second inverter 22 including a load transistor DQ5 and a drive transistor DQ3, and access transistors DQ1 and DQ2. The first inverter 21 and the second inverter 22 are connected via memory hold nodes DS1 and DS2 (hereinafter, simply referred to as nodes DS1 and DS2), thereby composing a latch circuit.

In the memory cell 1, the transistors having the same functions (access transistors Q1 and Q2, load transistors Q5 and Q6, and drive transistors Q3 and Q4) are formed with same dimensions and same performance, respectively, if manufacturing error is ruled out. The transistors are arranged in a symmetrical manner with respect to an intersection O of an X axis and a Y axis shown in FIG. 4 and contours thereof are also symmetrical.

On the other hand, properties of at least one transistor among the transistors DQ1 to DQ6 included in the dummy memory cell 1a are different from those of a corresponding transistor among the transistors Q1 to Q6 included in the memory cell 1. Here, the transistor, corresponding to the access transistor DQ1 in the dummy memory cell 1a, in the memory cell 1 is the access transistor Q1.

In the dummy memory cell 1a, as shown in FIG. 5, gate widths and gate lengths of the transistors having the same functions (access transistors DQ1 and DQ2, load transistors DQ5 and DQ6, and drive transistor DQ3 and DQ4) arranged in a symmetrical manner with respect to an intersection O of an X axis and a Y axis are partly different. Therefore contours of the transistors arranged in the symmetrical manner with respect to the intersection O of the X axis and the Y axis are partly asymmetrical. The asymmetry of the contours thereof is attributed to designing the dummy memory cell 1a so that the write time required for the dummy memory cell 1a is more than or equal to that required for the memory cell 1.

An example of a relationship between the dimensions of the transistors DQ1 to DQ6 shown in FIG. 5 and those of the transistors Q1 to Q6 shown in FIG. 4 is shown in the following formulae (1) to (6).

$$DW1(=DW2)<W1(=W2) \quad (1)$$

$$DL1(=DL2)>L1(=L2) \quad (2)$$

$$DW4(=W3=W4)<DW3 \quad (3)$$

$$DL4(=L3=L4)>DL3 \quad (4)$$

$$DW6>DW5(=W5=W6) \quad (5)$$

$$DL6<DL5(=L5=L6) \quad (6)$$

Here, gate lengths and gate widths of transistors DQi (i is an integer which is more than or equal to 1 but less than or equal to 6) included in a dummy memory cell 1a are represented as DLi and Dwi respectively, and gate lengths and gate widths of transistors Qi included in a memory cell 1 are represented as Li and Wi respectively.

Conditions (for example, impurity concentration and configuration of each region on a substrate) other than dimensions of gates are the same between the transistors Q1 to Q6 and the transistors DQ1 to DQ6, respectively. Therefore, properties are different between the transistors having different gate lengths and different gate widths. When the properties of the transistors DQ1 to DQ6 included in the dummy memory cell 1a are different from those of the corresponding transistors Q1 to Q6 included in the memory cell 1, even if other write conditions are the same, write time is different between the dummy memory cell 1a and the memory cell 1.

A difference of the write time between the dummy memory cell 1a and the memory cell 1 can be obtained by utilizing circuit simulation with a computer. The "circuit simulation" herein means simulation with which error distribution or the like of transistor dimensions, caused by manufacturing error or the like, and fluctuations in write time for memory cells can be obtained. The dummy memory cell 1a is designed so that the write time for the dummy memory cell 1a is the same as or minutely longer than a maximum of the write time (hereinafter, referred to as "longest write time") for the memory cells 1. Thus writing to every memory cell 1 can be ensured but at the same time power consumption of the semiconductor memory device can be reduced.

Hereinafter, specific procedures of writing to a memory cell 1 will be described by exemplifying more specific circuit structures of the semiconductor memory device according to the present embodiment in FIG. 6 to FIG. 10. An "on" state herein refers to a state in which there is continuity between a source electrode and a drain electrode through applying a predetermined voltage on a gate electrode, and an "off" state herein refers to a state in which there is no continuity between the source electrode and the drain electrode because the predetermined voltage is not applied on the gate electrode.

Figure 6:
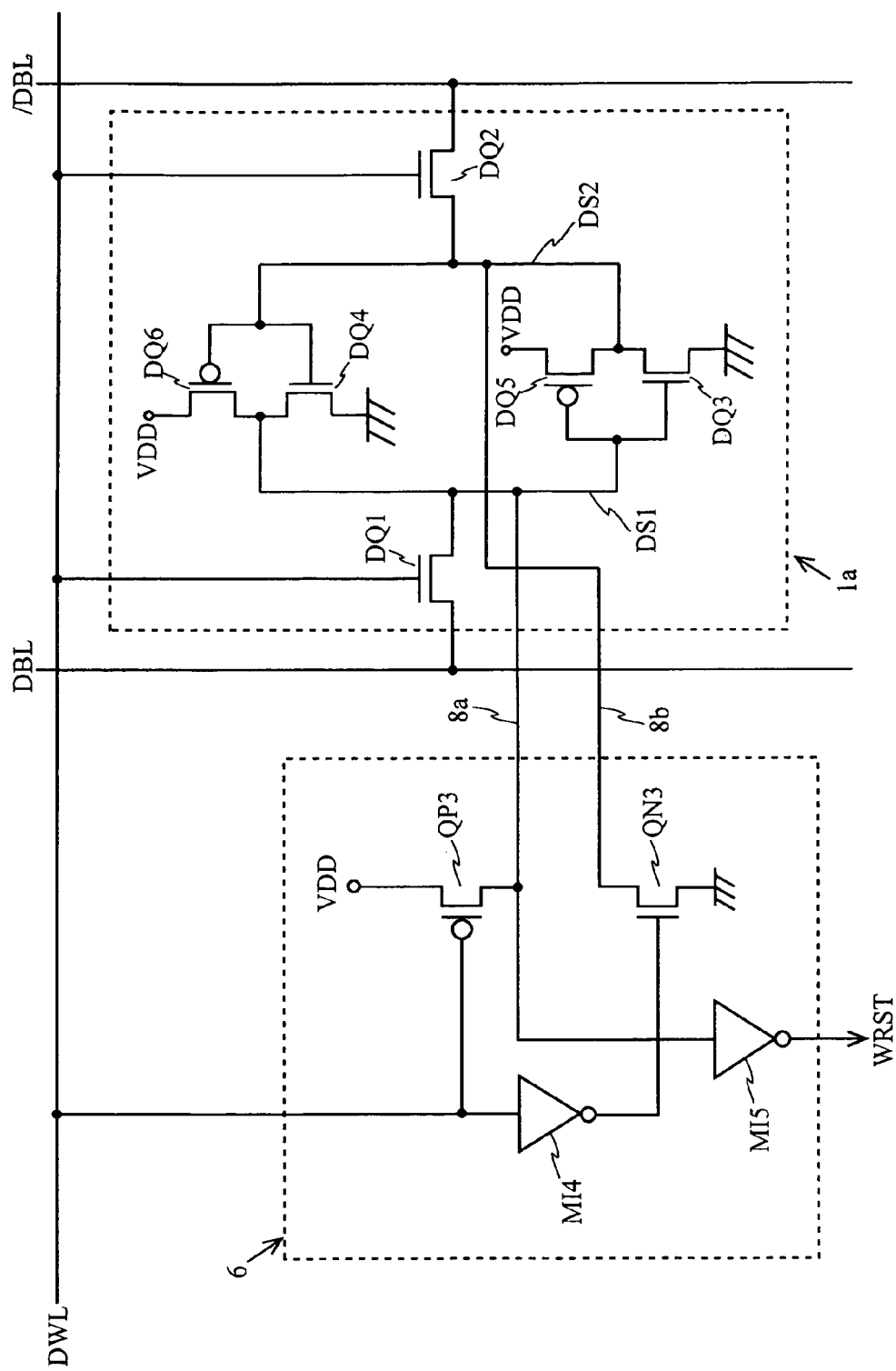
FIG. 6 is a circuitry diagram showing an example of the dummy memory cell and a write state detection section.

FIG. 6 shows a circuitry diagram of an example of the write state detection section 6 connected to a dummy memory cell 1a. The write state detection section 6 is a circuit functioning to output the write completion signal WRST of a voltage level according to a write state (voltage levels of nodes DS1 and DS2) of the dummy memory cell 1a and functioning to return a storage state of the dummy memory cell 1a to an initial state.

When a dummy word line DWL is not selected (at L level), a p-type MOS transistor QP3 and an n-type MOS transistor QN3 of the write state detection section 6 are both turned on and the write completion detection signal WRST which is an output from an inverter MI5 is at L level. And the node DS1 of the dummy memory cell 1a is at H level (VDD level) and a node DS2 of the dummy memory cell 1a is at L level (ground level). A storage value of the dummy memory cell 1a in the initial state shown with these voltage levels is "1".

On the other hand, when the dummy word line DWL is selected (at H level), the p-type MOS transistor QP3 and the n-type MOS transistor QN3 are both turned off. The write completion detection signal WRST is at L level when the node DS1 is at H level and is at H level when the node DS1 is at L level.

As described above, the write completion signal WRST is at L level when the dummy word line DWL is at L level and is at a voltage level according to the write state of the dummy memory 1a when the dummy word line DWL is at H level. The write state detection section 6 outputs the write completion signal WRST to the write amplifier control section 7 and other timing control circuitry (not shown).

Figure 7:
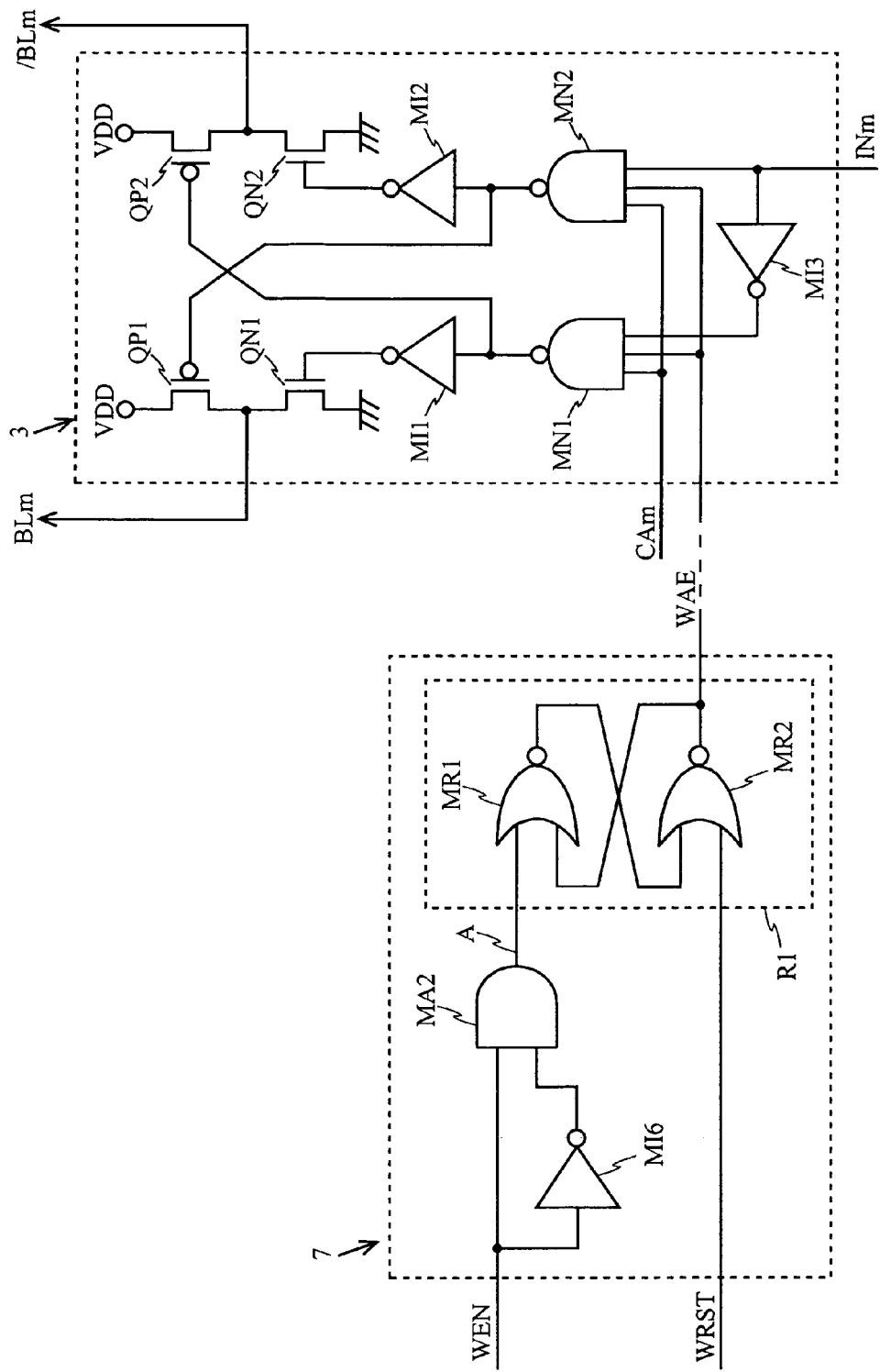
FIG. 7 is a circuitry diagram showing an example of a write amplifier control section and a write amplifier.

FIG. 7 shows a circuitry diagram of an example of the write amplifier control section 7 and the write amplifier 3. The write amplifier control section 7 comprises an inverter MI6, a 2-input AND circuit MA2, and an RS latch circuit R1 including 2-input NOR circuits MR1 and MR2. The write amplifier control section 7 generates the write amplifier control signal WAE based on the write enable signal WEN and the write completion signal WRST. The write enable signal WEN indicates timing accessible to the memory cell 1 and the dummy memory cell 1a. Properties and a structure of the dummy write amplifier 3a are the same as those of the write amplifier 3.

Figure 8:
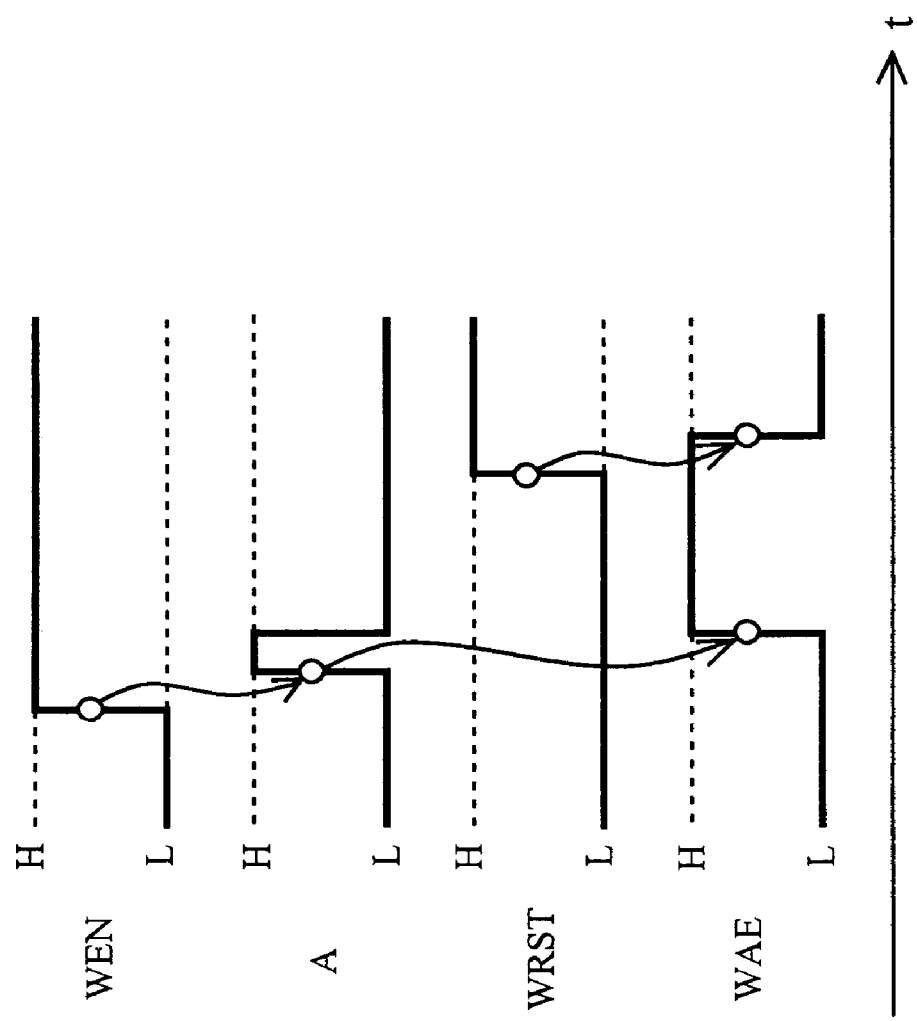
FIG. 8 is a timing diagram for a write enable signal WEN, a signal A, a write completion signal WRST, and a write amplifier control signal WAE.

FIG. 8 shows a timing diagram of the write enable signal WEN, a signal A, the write completion signal WRST, and the write amplifier control signal WAE. In an initial state before processing of writing to a memory cell 1 is performed, the write enable signal WEN at L level and the write completion signal WRST at L level are inputted to the write amplifier control section 7. In this state, the write amplifier control section 7 generates the write amplifier control signal WAE at L level.

When the write enable signal WEN shifts to H level, a narrow pulse of a time width determined by the inverter MI6 occurs on the signal A which is an output from the 2-input AND circuit MA2. The signal A, i.e., a set input for the RS latch circuit R1, causes the write amplifier control signal WAE to shift to H level. In other words, based on the shift (rise) of the write enable signal, rise timing of the write amplifier control signal WAE and thus write operation start timing for a memory cell 1 are determined. And fall timing of the write amplifier control signal WAE is determined based on the shift (rise) of the write completion signal WRST. Rise timing of the write completion signal WRST will be described step by step.

The write amplifier signal WAE outputted by the write amplifier control section 7 is inputted to all the write amplifiers 3 and the dummy amplifiers 3a. However, in order to simplify the description, only one write amplifier 3 is shown in FIG. 7. A column selection signal CA at H level is inputted to the write amplifier 3 associated with a column including a memory cell 1 for which a write operation is to be performed and a column selection signal CA at L level is inputted to the write amplifier 3 associated with a column including a memory cell 1 for which a write operation is not to be performed.

When the column selection signal CA and the write amplifier control signal WAE are both at H level and further the write data INm is also at H level, an output from a 3-input NAND circuit MN1 and an output from a 3-input NAND circuit MN2 are at H level and L level, respectively. In this state, an output from the inverter MI1 and an output from the inverter MI2 are at L level and H level, respectively. Thus the p-type MOS transistor QP1 and the n-type MOS transistor QN2 are turned on and n-type MOS transistor QN1 and p-type MOS transistor QP2 are turned off. In this state, a bit line BLm is at H level and an inverted bit line /BLm is at L level. In this state, when a word line WLn is selected, "1" is written to a memory cell 1 which is connected to the word line WLn and the bit line pair {BLm and /BLm}. And when the write data INm is at L level, causing the bit line BLm and the inverted bit line /BLm to be at L level and H level respectively, "0" is written to a memory cell 1.

When either the column selection signal CAm or the write amplifier control signal WAE is at L level, the p-type MOS transistors QP1 and QP2 and the n-type MOS transistors QN1 and QN2 are all turned off. Thus the write amplifier 3 is in a high-impedance (an inactive) state.

On the other hand, the write amplifier control signal WAE, the dummy column selection signal DCA, and the data DIN are inputted to the dummy amplifier 3a. The dummy column selection signal DCA is controlled at H level in synchronization with any of the column selection signals CAm being controlled at H level. The dummy data DIN is constantly at L level and when a write operation for any of the memory cell 1 is performed, "0" is sure to be written to the dummy memory cell 1a.

Figure 9:
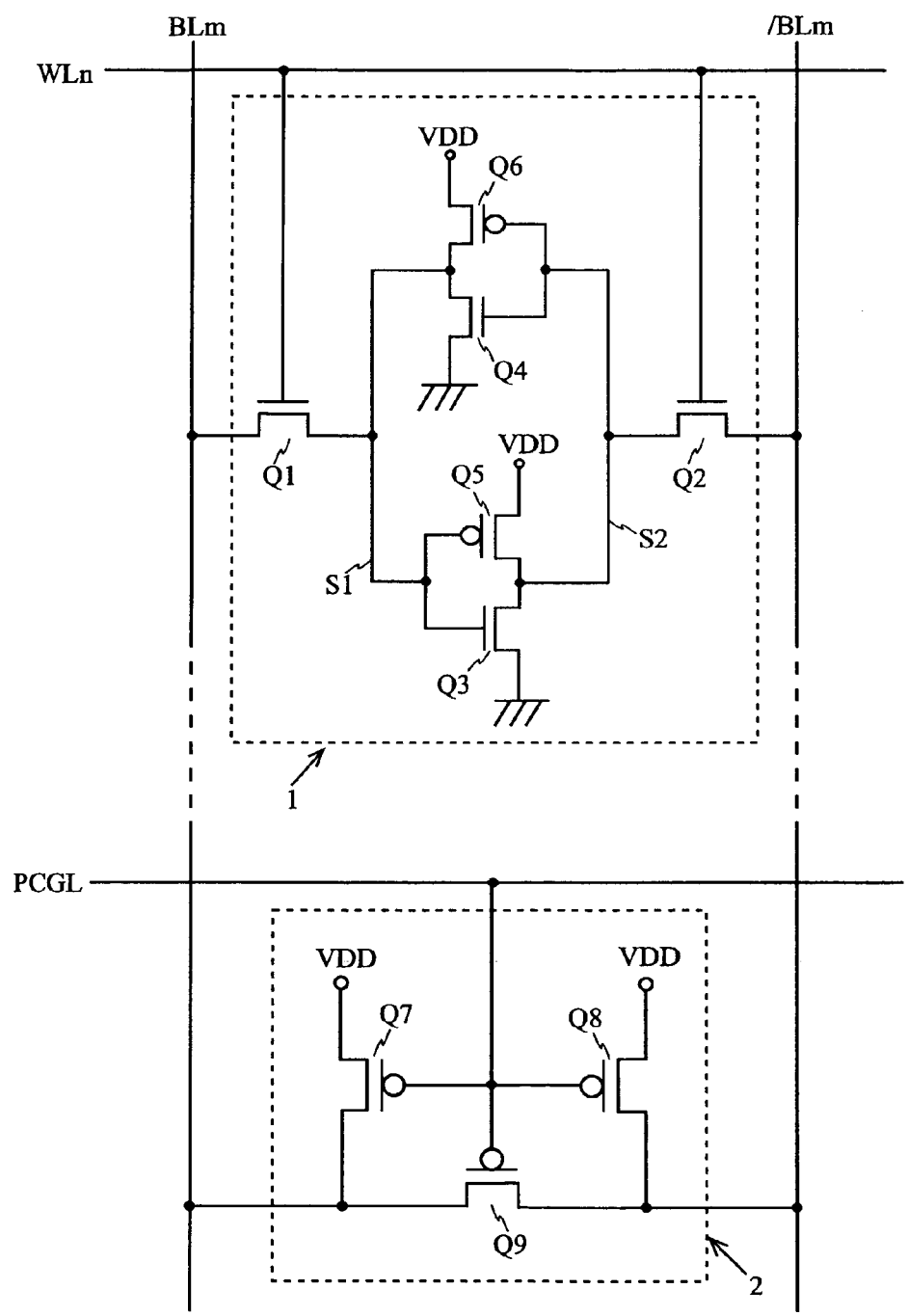
FIG. 9 is a circuitry diagram showing an example of a precharge circuit section and the memory cell.

FIG. 9 shows an example of a circuit diagram showing a precharge circuit section 2 and a memory cell 1 belonging to the same column as that the precharge circuit section 2 does. This precharge circuit section 2 comprises precharge transistors Q7 and Q8 and an equalizer transistor Q9, all of which are p-type MOS transistor.

When write operations for a memory cell 1 and a dummy memory cell 1a is performed, a bit line precharge line PCGL is controlled at H level and the precharge circuit section 2 is in a high-impedance state, i.e. an inactive state. On the other hand, when the write operation is not performed, the bit line precharge line PCGL is controlled at L level and thereby the precharge circuit section 2 is in an active state, equipotentializing the bit line pair {BLm and /BLm}. In this state, the bit line pair {BLm and /BLm} takes H level (VDD level).

A data write operation for a memory cell 1 is to give a potential difference between a bit line pair {BLm and /BLm} in a state where the memory cell 1 and the bit line pair {BLm and /BLm} are electrically connected. On the memory cell 1 shown in FIG. 9, the word line WL is controlled at H level and thereby the memory cell 1 and the bit line pair {BLm and /BLm} are electrically connected and voltage levels of nodes S1 and S2 shift according to the potential difference between the bit line pair {BLm and /BLm} controlled by the write amplifier 3.

During the write operation for the memory cell 1, when the nodes S1 and S2 take H level and L level, respectively, the memory cell 1 stores "1" and when the nodes S1 and S2 take L level and H level, respectively, the memory cell 1 stores "0".

Similarly to the write operation for the memory cell 1, a write operation for a dummy memory cell 1a is to give a potential difference between a dummy bit line pair {DBL and /DBL}, by using the dummy write amplifier 3a, in a state where the dummy memory cell 1a and the dummy bit pair {DBL and /DBL} are electrically connected. During the write operation for the dummy memory cell 1a, when nodes DS1 and DS2 take L level and H level, respectively, the dummy memory cell 1a stores "0".

Here, FIG. 6 to FIG. 8 will be referred to again. When the write operation starts, the dummy bit line pair {DBL and /DBL} shown in FIG. 6 is controlled at L level and H level, respectively and thereby the nodes DS1 and DS2 of the dummy memory cell 1a shift from H level and L level to L level and H level, respectively. And when the nodes DS1 and DS2 of the dummy memory cell 1a take L level and H level respectively, the write completion signal WRST shifts to H level.

As shown in FIG. 7 and FIG. 8, the write amplifier control signal WAE shifts to L level responding to the write completion detection signal WRST controlled at H level. And when the write amplifier control signal WAE is at L level, the p-type MOS transistors QP1 and QP2 and the n-type MOS transistors QN1 and QN2 of the write amplifier 3 are all turned off. Thereby the write amplifier 3 is in a high-impedance state and the write operation for the memory cell 1 and the dummy memory cell 1a ends.

As described above, pulse widths of the write amplifier control signal WAE, i.e., time lengths of write operations for a memory cell 1 and a dummy memory cell 1a, are determined by rise timing of the write enable signal WEN and rise timing of the write completion signal WRST. And the rise timing of the write completion signal WRST is determined by write completion timing for the dummy cell 1a. In other words, based on timing at which storing data for the dummy memory cell 1a has been completed, end timing of the write operation for the memory cell 1 is determined.

In synchronization with the end timing of the write operation, the word line WLn, the dummy word line DWL and the bit line precharge line PCGL are controlled at L level. Thereby all the memory cells 1 are in a high-impedance state and hold a storage state. On the other hand, a storage value of the dummy memory cell 1a shifts "0" to "1" (an initial value). This is because the nodes DS1 and DS2 of the dummy memory cell 1a shift from L level and H level to H level and L level respectively, due to an action of the write state detection section 6. Voltage supply timing for the word line WLn, the dummy word line DWL, and the bit line precharge line PCGL can be determined by the write completion signal WRST or the write amplifier control signal WAE.

Voltage levels of the nodes DS1 and DS2 of the dummy memory cell 1a, immediately after starting the write operation, shift between H level and L level in a continuous manner, not in a discrete manner. The time required for shifting voltages is dependent on capabilities or the like of transistors included in the dummy memory cell 1a.

Figure 10:
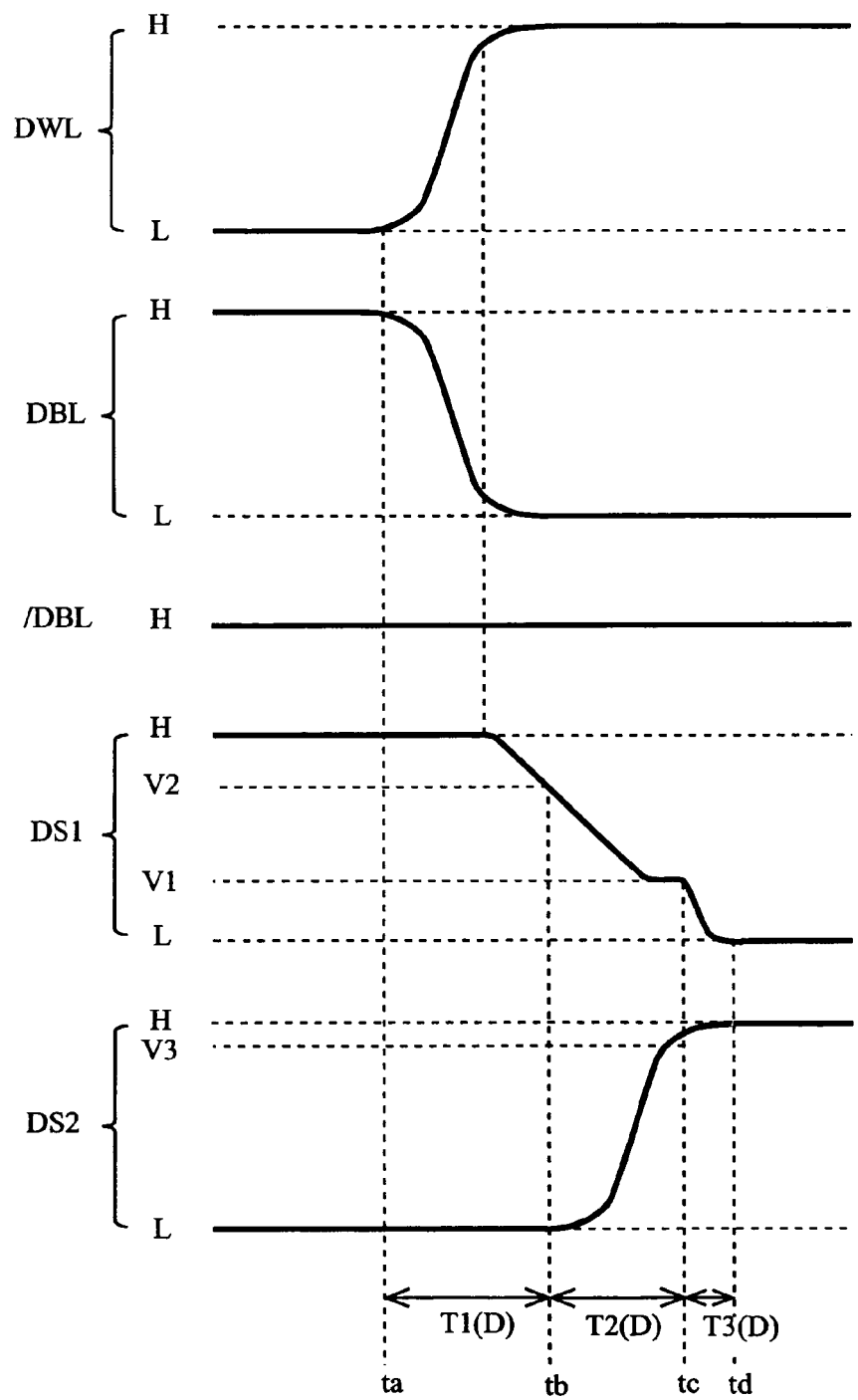
FIG. 10 is a diagram showing voltage shifts of a dummy word line, a dummy bit line pair, and nodes DS1 and DS2 during a write operation for the dummy memory cell.

Here, referring to FIG. 10, voltage shifts, as time passes, of the nodes DS1 and DS2 or the like during the write operation for the dummy memory cell 1a will be described. FIG. 10 shows the voltage shifts, as time passes, of the dummy word line DWL, the dummy bit line DBL, the inverted dummy bit line /DBL, and the nodes DS1 and DS2.

First, in an initial state, the node DS1 is at H level and the node DS2 is at L level. In this state, the load transistor DQ6 and the drive transistor DQ4 shown in FIG. 3 are on and off, respectively. And the load transistor DQ5 and the drive transistor DQ3 shown in FIG. 3 are off and on, respectively.

Next, in synchronization with the dummy bit pair {DBL and /DBL} controlled by the dummy write amplifier 3a so as to be at L level and H level, respectively, the dummy word line DWL and the bit line precharge line PCGL are controlled at H level and L level, respectively. As shown in FIG. 10, when the voltage level of the dummy word line DWL exceeds an operation threshold of the access transistor DQ1, the voltage level of the node DS1 falls, at a predetermined velocity, to a voltage level V1 which is determined by capacity of the access transistor DQ1 and the load transistor DQ6.

If the voltage level of the node DS1, while falling, reaches V2 which is a switching voltage from a second inverter 22, the second inverter 22 performs a switching operation and the voltage level of the node DS2 shifts from L level to H level. And if the voltage level of the node DS2, while rising, reaches V3 which is a switching voltage from a first inverter 21, the first inverter 21 performs a switching operation and the voltage level of the node DS1 shifts to L level. That the voltage level of the node DS1 is at L level indicates that the write operation for the dummy memory cell 1a has been completed.

Therefore, the write time T (D) for the dummy memory cell 1a is shown in the following formula (7), $$T(D)=T1(D)+T2(D)+T3(D) \quad (7)$$

wherein a time length from voltage rise time ta (or voltage rise time of the dummy word line DWL) of the dummy bit line DBL to time tb at which the first inverter 21 performs a switching operation is T1 (D); a time length from the time tb to time tc at which the second inverter 22 performs a switching operation is T2 (D); and a time length from the time tc to time td at which the node DS1 takes H level is T3 (D).

Similarly, the write time T (M) for the memory cell 1 is shown in the following formula (8), $$T(M)=T1(M)+T2(M)+T3(M) \quad (8)$$

wherein a time length from voltage fall time ta' (or voltage fall time of the inverted bit line /BLn) (=ta) of the bit line BLn to time tb' at which the first inverter 11 performs a switching operation is T1 (M); a time length from the time tb' to time tc' at which the second inverter 12 performs a switching operation is T2 (M); and a time length from the time tc' to time td' at which the node S1 takes H level is T3 (M).

In the semiconductor memory device according to the present embodiment, the relationship between the write time T (D) for the dummy memory cell 1a and the longest write time T (Mmax) for the memory cell 1 satisfies the following formula (9), $$T(D)=T(M\text{max})+\Delta t \tag{9}$$

wherein Δ t is greater than 0 and is preferably approximated to 0 in order to reduce the write time.

An example of design procedure for this kind of the dummy memory cell 1a will be described below. First, memory cells 1 are designed and a longest write time T (Mmax) for the designed memory cells 1 is obtained by using the circuit simulation. And the dummy cell 1a is designed by adjusting properties or the like of transistors included in the memory cell 1, so that the obtained longest write time T (Mmax) is more than or equal to a shortest write time with the manufacturing error taken into account.

In order to attain the time T1 (D)>T1 (M) for satisfying the formula (9), a capability of the access transistor DQ1 is made less than a capability of the access transistor Q1, and a capability of the load transistor DQ6 is made greater than a capability of the load transistor Q6. Thus by adjusting the capability of the access transistor DQ1 and/or the load transistor DQ6, a voltage fall speed of the node DS1 can be decreased.

And in order to attain the time T1 (D)>T1 (M), a capability of the drive transistor DQ3 is made greater than a capability of the drive transistor Q3 and a capability of the load transistor DQ5 is made less than a capability of the load transistor Q5. Thus by adjusting the drive transistor DQ3 and/or the load transistor DQ5, the switching voltage level of the first inverter 21 can be lowered.

In order to attain the time T2 (D)>T2 (M) for satisfying the formula (9), a capability of the access transistor DQ2 is made less than a capability of the access transistor Q2 and a capability of the drive transistor DQ3 is made greater than a capability of the drive transistor Q3. Thus by adjusting the capability of the access transistor DQ2 and/or the drive transistor DQ3, a voltage rise speed of the node DS2 can be slowed.

And in order to attain the time T2 (D)>T2 (M), a capability of the drive transistor DQ4 is made less than a capability of the drive transistor Q4 and a capability of the load transistor DQ6 is made greater than a capability of the load transistor Q6. Thus by adjusting the capability of the drive transistor DQ4 and/or the load transistor DQ6, the switching voltage level of the second inverter 22 can be heightened.

All conditions described above are represented as gate lengths and gate widths of transistors as shown in the following formulae (10) to (15).

$$DL1>L1 \text{ and/or } DW1<W1 \tag{10}$$

$$DL2>L2 \text{ and/or } DW2<W2 \tag{11}$$

$$DL3<L3 \text{ and/or } DW3>W3 \tag{12}$$

$$DL4>L4 \text{ and/or } DW4<W4 \tag{13}$$

$$DL5>L5 \text{ and/or } DW5<W5 \tag{14}$$

$$DL6<L6 \text{ and/or } DW6>W6 \tag{15}$$

It is discretionary which, among the conditions shown in the above formulae (10) to (15), is applied. Thus, if performance of at least one transistor among the transistors DQ1 to DQ6 included in the dummy memory cell 1a is different from that of a corresponding transistor among the transistors Q1 to Q6 included in the memory cell 1, the condition shown in the formula (9) can be satisfied.

The transistors DQ1, DQ3, and DQ5 included in the dummy memory cell 1a and the transistors DQ2, DQ4, and DQ6 included in the dummy memory cell 1a are respectively arranged in a point-symmetrical manner with respect to a center of symmetry. In a case where the formula (9) is satisfied, it is more likely that a dimension/dimensions of at least one transistor among the transistors DQ1 to DQ6 which are included in the dummy memory cell 1a and arranged in the symmetrical manner is/are different from that/those of a corresponding and symmetrically arranged transistor among the transistors DQ1 to DQ6 included in the memory cell.

Even if the capability of the access transistors DQ1 and Q1 and the load transistors DQ6 and Q6 are identical, the time T1 (D) can be made longer than the time T1 (M) by applying a load on the node DS1 (inserting a capacitive element). In other words, when a load on the node DS1 is made greater than that on the node S1, even if other conditions are same, the write time for the dummy memory cell 1a is longer than that for the memory cell 1.

To what extent of a dimension/dimensions of the at least one transistor included in the dummy memory cell 1a is made different from the corresponding transistor included in the memory cell 1 and to what extent of the load is inserted to the node DS1 are determined according to optimum write time, which is obtained by the circuit simulation, for the dummy memory cell 1a.

A method for making the write time for the dummy memory cell 1a longer than that for the memory cell 1 may be methods other than differentiating the properties of the dummy memory cell 1a from those of the memory cell 1. For example, the write time for the dummy memory cell 1a can be made longer than that for the memory cell 1 by making a load on the dummy bit line DBL greater than that on the bit line BL. To what load to be applied on the dummy bit line DBL can be determined according to the optimum write time, obtained by the circuit simulation, for the dummy memory cell 1a.

In addition, the write time for the dummy memory cell 1a can be made longer than the write time for the memory cell 1 by making a capability of the dummy write amplifier 3a less than that of the write amplifier 3. To what extent of the capability of the write amplifier 3 is adjusted can be determined according to the optimum write time, obtained by the circuit simulation, for the dummy memory cell 1a.

The methods described above are just examples, and methods other than these may be employed for making the write time for the dummy memory cell 1a more than or equal to maximum write time for the memory cell 1. In addition, the circuits shown in FIG. 2 and FIG. 3 are just examples of a memory cell 1 and a dummy memory cell 1a. Therefore, for example, the load transistors Q5 and Q6 as well as DQ5 and DQ6 may be replaced with resistive elements. A layout of the memory cell 1 and the dummy memory cell 1a, as shown in FIG. 4 and FIG. 5, may not be point-symmetrical, and may be, for example, x-axis-symmetrical or y-axis-symmetrical.

On the semiconductor memory device according to the present embodiment, the write time for the dummy memory cell 1a is designed so as to be more than or equal to the maximum write time for the memory cell 1. And based on the write completion signal indicating that the write operation for the dummy memory cell 1a has been completed, the end timing of the write operations for the memory cell 1 and the dummy memory cell 1a is determined.

Accordingly, the semiconductor memory device according to the present embodiment is capable of generating a write control signal (write amplifier control signal WAE) having an optimum pulse width which ensures complete writing to all memory cells 1. In other words, according to the semiconductor memory device of the present embodiment, the write operation is not ended before storing data for the memory cell 1 has been completed and the write time is not made excessively longer than necessary. Thus according to the present embodiment, a semiconductor memory device capable of a high-speed write operation with low power consumption can be realized.

The semiconductor memory device of the present embodiment is applicable to not only a single memory device but also to a variety of semiconductor devices, such as a system device incorporating memory circuitry.

The concept of the present invention is also applicable to read control. In other words, by designing a semiconductor memory device in which read time required for reading stored data in a dummy memory cell is made longer than read time required for reading stored data in a memory cell, read timing control can be optimized.

The semiconductor memory device according to the present invention can ensure that all memory cells are written, regardless of fluctuations in properties of the memory cells, which are caused by manufacturing error or the like, and also can reduce write operation time and power consumption.

While the invention has been described in detail, the foregoing description is in all aspects illustrative and not restrictive. It is understood that numerous other modifications and variations can be devised without departing from the scope of the invention.

What is claimed is:

1. A semiconductor memory device in which write operation end timing for a memory cell is determined by using a dummy memory cell, comprising:
    a plurality of memory cells;
    the dummy memory cell;
    a write state detection section outputting a write completion signal when the dummy memory cell takes a predetermined storage state; and
    a write operation section for performing a write operation based on the write completion signal; wherein
    write time required for the dummy memory cell is more than a maximum of write time required for the memory cells.

2. The semiconductor memory device according to claim 1, wherein
    transistors included in the dummy memory cell are connected in a same manner as corresponding transistors included in the memory cell,
    a property of at least one transistor included in the dummy memory cell is different from a property of the corresponding transistor included in the memory cell.

3. The semiconductor memory device according to claim 2, wherein a gate length of at least one of the transistors included in the dummy memory cell is different from a gate length of the corresponding transistor included in the memory cell.

4. The semiconductor memory device according to claim 2, wherein a gate width of at least one of the transistors included in the dummy memory cell is different from a gate width of the corresponding transistor included in the memory cell.

5. The semiconductor memory device according to claim 2, wherein at least two transistors among a plurality of transistors included in the dummy memory cell are arranged in a symmetrical manner, and gate lengths of the at least two transistors are mutually different in at least one couple of the at least two transistors.

6. The semiconductor memory device according to claim 2, wherein at least two transistors among the plurality of transistors included in the dummy memory cell are arranged in the symmetrical manner, and gate widths of the at least two transistors are mutually different in at least one couple of the at least two transistors.

7. The semiconductor memory device according to claim 1, wherein
    transistors included in the dummy memory cell are connected in a same manner as corresponding transistors included in the memory cell,
    a load of a predetermined one of the transistors included in the dummy memory cell is different from a load of the corresponding transistor included in the memory cell.

8. The semiconductor memory cell according to claim 1, wherein a load on a dummy bit line connected to the dummy memory cell is larger than a load on a bit line connected to the memory cell.

9. The semiconductor memory cell according to claim 1, including the write operation section comprising:
    a write amplifier for controlling a voltage applied to a bit line pair connected to the memory cell; and
    a dummy write amplifier for controlling a voltage applied to a dummy bit line pair connected to the dummy memory cell, wherein
    a dummy bit line driving capability of the dummy write amplifier is less than a bit line driving capability of the write amplifier.

* * * * *